(12) United States Patent
Sumino et al.

(10) Patent No.: US 9,715,928 B2
(45) Date of Patent: Jul. 25, 2017

(54) PAGE PROGRAMMING SEQUENCES AND ASSIGNMENT SCHEMES FOR A MEMORY DEVICE

(71) Applicant: SONY CORPORATION, Tokyo (JP)

(72) Inventors: Jun Sumino, Boise, ID (US); Makoto Kitagawa, Folsom, CA (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/161,698

(22) Filed: May 23, 2016

(65) Prior Publication Data

US 2016/0267977 A1  Sep. 15, 2016

Related U.S. Application Data

(63) Continuation of application No. 14/560,750, filed on Dec. 4, 2014, now Pat. No. 9,373,397.

(51) Int. Cl.
*G11C 11/00* (2006.01)
*G11C 13/00* (2006.01)

(52) U.S. Cl.
CPC ...... *G11C 13/0069* (2013.01); *G11C 13/0002* (2013.01); *G11C 13/003* (2013.01); *G11C 13/004* (2013.01); *G11C 13/0023* (2013.01); *G11C 13/0026* (2013.01); *G11C 13/0028* (2013.01); *G11C 13/0097* (2013.01); *G11C 13/0061* (2013.01); *G11C 2013/0085* (2013.01); *G11C 2213/79* (2013.01); *G11C 2213/82* (2013.01)

(58) Field of Classification Search
CPC ....... G11C 16/10; G11C 7/12; G11C 16/0483; G11C 16/24; G11C 2211/5641; G11C 7/1006; G11C 2207/104; G11C 16/16; G11C 7/065; G11C 7/1039; G11C 7/22; G11C 8/08; G11C 16/26; G11C 16/3459; G11C 2207/229
USPC ............ 365/185.11, 230.06, 230.03, 185.12, 365/189.05, 219, 222, 185.03, 185.18, 365/203, 185.2, 185.21, 185.22, 185.26
See application file for complete search history.

(56) References Cited

U.S. PATENT DOCUMENTS

2014/0362633 A1* 12/2014 Otsuka ............... G11C 13/0097
365/148

\* cited by examiner

*Primary Examiner* — Thong Q Le
(74) *Attorney, Agent, or Firm* — Sheridan Ross P.C.

(57) ABSTRACT

Embodiments of the invention are directed towards a memory device comprising a plurality of wordlines each coupled to a row of memory cells in a subtile of the memory device, a plurality of level one column select circuits coupled to each cell in a plurality of groups of cells in a subtile, a plurality of level two column select circuits coupled to each of the plurality of groups of cells in the subtile, a common bit line coupled to the plurality of level one column select circuits and the plurality of level two column select circuits, the common bit line also coupled to a sense and program circuit, wherein the sense and program circuit addresses each first cell in each of the groups of cells to form a single page of memory.

4 Claims, 7 Drawing Sheets

FIG. 1 (REFERENCE ART)

PAGE PROGRAMMING SEQUENCES AND ASSIGNMENT SCHEMES FOR A MEMORY DEVICE

CROSS REFERENCE TO RELATED APPLICATIONS

This application is a continuation of U.S. application Ser. No. 14/560,750, filed Dec. 4, 2014, the disclosure of which is incorporated herein by reference in its entirety.

FIELD

Certain embodiments of the disclosure relate to page programming sequences and assignment schemes for a memory device.

BACKGROUND

Resistive RAMs (ReRAMs) have emerged as leading candidates to displace conventional Flash memories due to their high density, good scalability, low power and high performance. Previous ReRAM designs demonstrating high performance have done so on low density arrays (such as those less than one Gigabit) while those reporting high-density arrays (such as greater than eight Gigabits) were accompanied by relatively low read and write performance.

Figure 1:
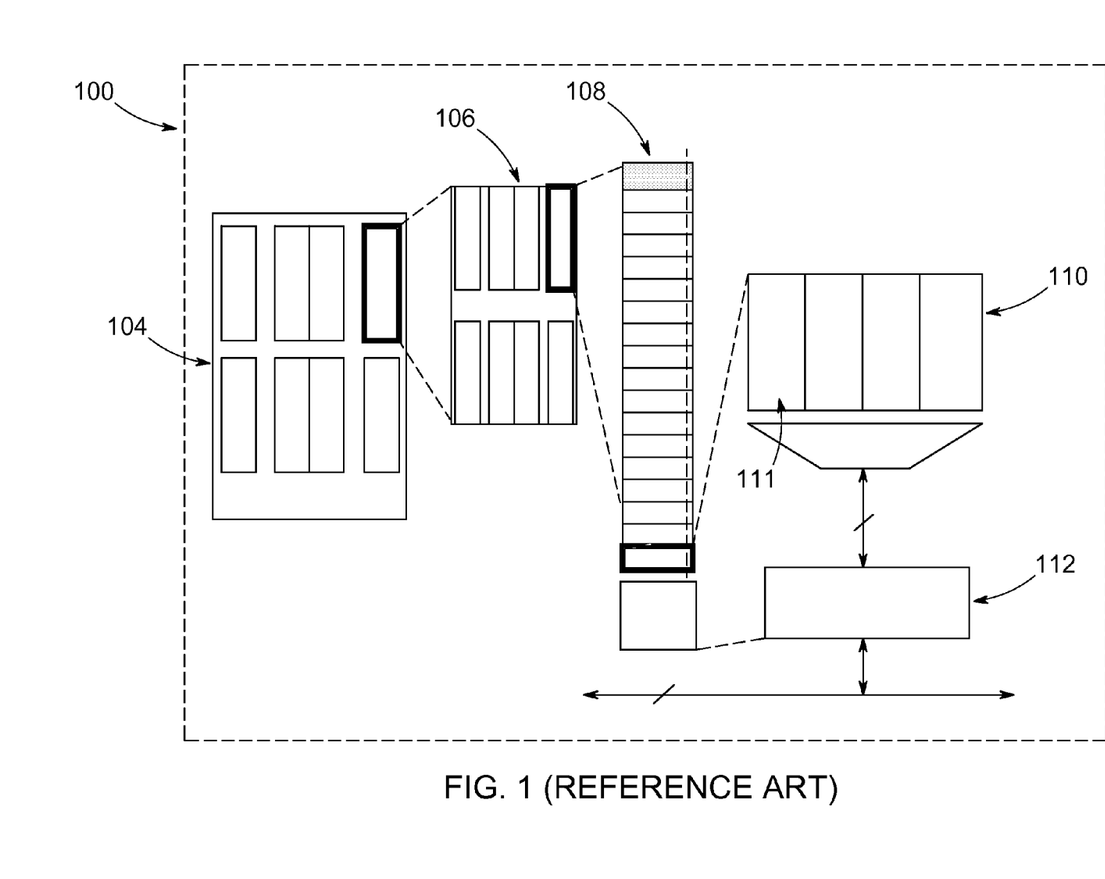
FIG. 1 depicts an exemplary array architecture for ReRAM in accordance with exemplary embodiments of the present invention.

FIG. 1 illustrates an exemplary embodiment of ReRAM array architecture of a memory device 100. Each chip may comprise several memory blocks. FIG. 1 illustrates memory block 102, comprising memory banks 104. Each memory bank comprises Y-strips 106, or vertical groups of tiles with a common global bitline (CBL). The Y-strip 108 comprises sixteen tiles and one redundant tile, where each tile is a matrix of 8,192 by 256 local bitlines and 2,048 wordlines. The tile 110 comprises 4 subtiles. During a sense operation and a program operation in a bank, 8 tiles (one per Y-strip) are activated simultaneously, each accessing a sub-page for a total sense/program concurrency of 512+16 cells. Since the page size is four times the number of sense/program circuits, there are 4 nibbles, where a nibble is defined as serial accesses to successive bitline addresses during the sense and program sequence performed by the sense and program circuits 112. The complete sense/program unit is a page of 8 sub-pages.

However, during the program operation performed by the sense and program circuits 112, if a page of a sub-tile is activated, the current applied to perform the operation may cause a thermal disturbance to memory cells in neighboring pages, increasing the temperature of the memory cells in the neighboring pages. While program operations can be performed on these neighboring pages, performance (number of verify loops) and reliability (data retention) are significantly degraded by the temperature increase. Consequently, a period of time elapses, generally, before operations are performed on the neighboring pages, thus increasing the program operation time.

Therefore, there is a need in the art for page programming sequences and assignments in memory devices that reduce program operation time in accordance with exemplary embodiments of the present invention.

SUMMARY

Page programming sequences and assignment schemes for a memory device are provided as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

Certain implementations of the invention may be found in several program operation sequences and addressing for a memory device. According to one embodiment, program (or, set) operations are performed on pages of the memory device by skipping adjacent pages. For example, the pulse issued by the sense and program circuit will control a column select circuit so that every other page is programmed sequentially, as opposed to adjacent pages being programmed sequentially. Accordingly, no thermal disturbance will be observed in the adjacent pages because the set operation is not applied until after the cells within the page have cooled. Similarly, other embodiments of the present invention modify the column select circuit such that a page is formed using non-adjacent cells.

Figure 2:
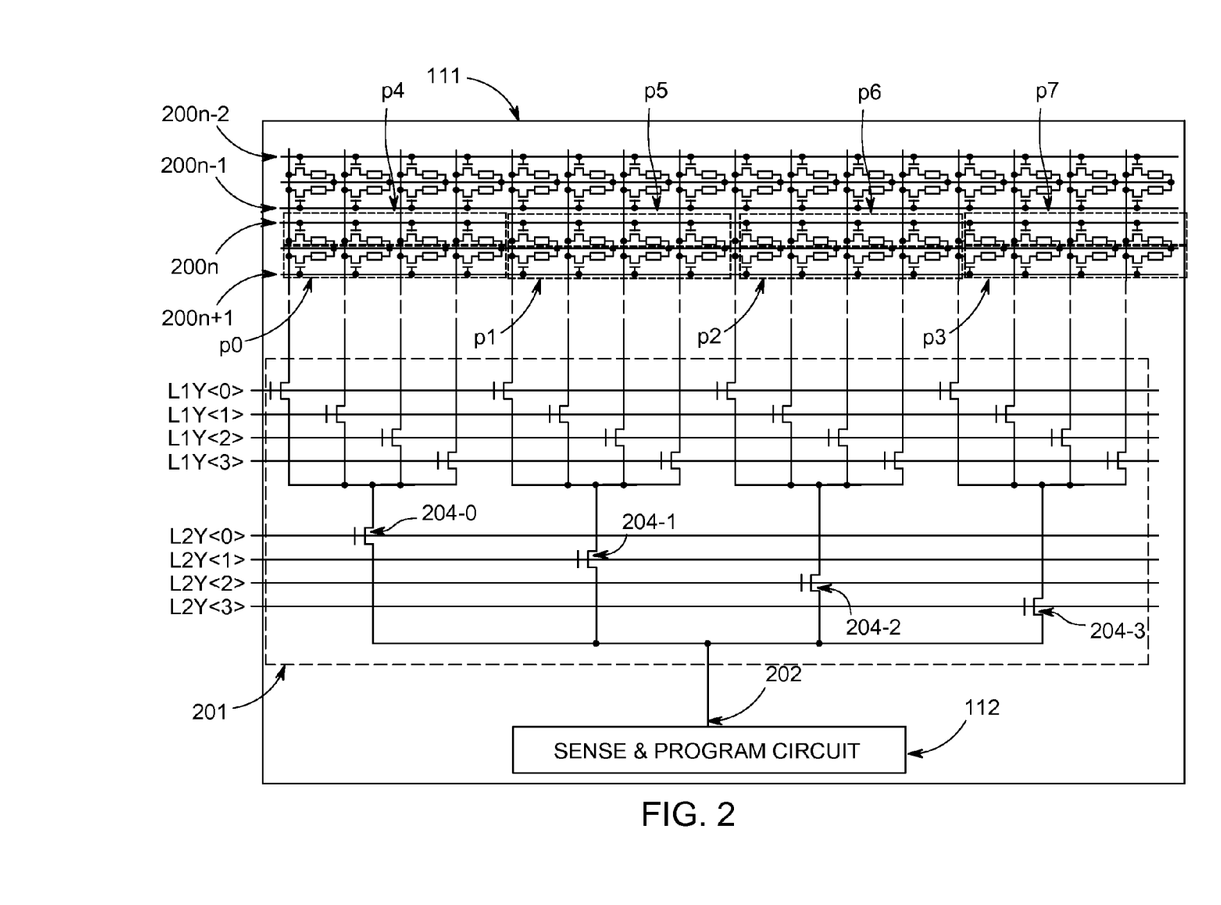
FIG. 2 depicts the column select circuit for a single sub-tile in a memory tile in accordance with exemplary embodiments of the present invention.

FIG. 2 depicts the column select circuit 201 for a single sub-tile 111 in the memory tile 110 in accordance with exemplary embodiments of the present invention.

Sub-tile 111 comprises a finite number of wordlines; those shown in FIG. 2 include $200n-2$ to $200n+1$ (collectively, wordlines 200). Those of ordinary skill in the art will recognize that each subtile may contain many wordlines to access a variety of different cells on the memory device. The sub-tile 111 comprises a plurality of memory cells, the cells aggregated into eight "pages" p0 to p7. The sense and program circuit 112 issues pulses to perform operations such as programming memory cells, sensing the value stored in memory cells and the like. The pulses are issued to the various memory cells via the common bit line (CBL) 202. The column select circuit 201 comprises a level one select (l1y) and a level 2 select (l2y). The CBL 202 is coupled to the l2y column selects respectively via switches 204-0 to 204-3. The wordlines 200 select a "row" of cells. The level 2 select (l2y) selects a group of four cells (one page) while the level 1 select (l1y) selects a particular cell. For example, an operation on the first cell of page p0 will be performed if wordline 200n+1 is selected, l2y<0> is selected and l1y<0> is selected. Similarly, an operation on the first cell of page p1 will be performed if wordline 200n+1 is selected, and l2y<1> and l1y<1> are selected.

However, if the set of cells in page p0 are programmed (i.e., set to a value), a thermal disturbance may be caused to cells in adjacent pages p4 and p1. Similarly, if the cells in page p1 are programmed, a thermal disturbance may be caused to cells in adjacent pages p0, p5 and p6. To avoid such a thermal disturbance, the addressing sequences shown in FIG. 3 are employed.

Figure 3:
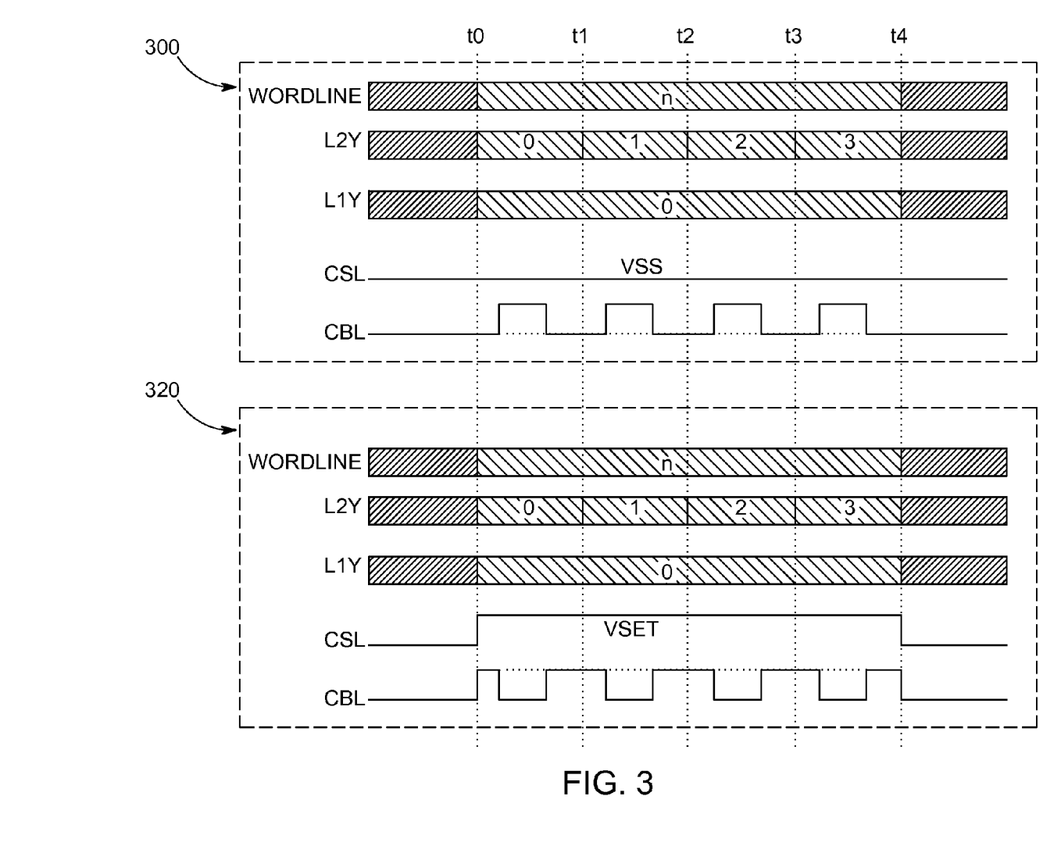
FIG. 3 depicts an addressing sequence for performing operations on memory cells using the column select circuit depicted in FIG. 2 in accordance with exemplary embodiments of the present invention.

FIG. 3 depicts an addressing sequence for performing operations on memory cells using the column select circuit depicted in FIG. 2 in accordance with exemplary embodiments of the present invention.

During the reset operation depicted in diagram 300, at a time t0 to t4, wordline n is selected, while the level 2 column select (l2y) sequentially selects l2y<0> to l2y<3>, respectively, at times t0, t1, t2 and t3. l1y<0> remains selected from time t0 to t4. The common source line (CSL) is set to Vss, while the CBL is raised to a voltage required for a reset operation, Vreset, to select the first memory cell from each page p0. After time t4, the next wordline (e.g., 200n+1) is selected and the next level 1 column select is selected (e.g., l1y<1> to l1y<3>) and so on until all the required cells are programmed, reset or sensed. Effectively, by modifying conventional addressing methods, a new page is formed using the first memory cells in page p0 to p4. Similarly, a second page is formed using the second memory cells in page p0 to p4, and so on.

During a set operation depicted in diagram 320, wordline n is selected from time t0 to t4. Similarly, l2y<0> to l2y<3> are sequentially selected respectively at times t0 to t3, while l1y<0> is selected from time t0 to t4 by raising the common bit line. At time t0, the CSL is raised to Vset (the voltage required to perform the set operation), while the CBL is raised to Vset or lowered from Vset to select each l2y select depending on its current value. The sequential selection of l2y<0> to l2y<3> while selecting l1y<0> results in a set operation being performed on each of the memory cells in p4 to p7. Effectively, by modifying conventional addressing methods, a new page is formed using the first memory cells in page p4 to p7. Similarly, a second page is formed using the second memory cells in page p4 to p7, a third page is formed using the third memory cells in page p4 to p7, and so on.

Figure 4:
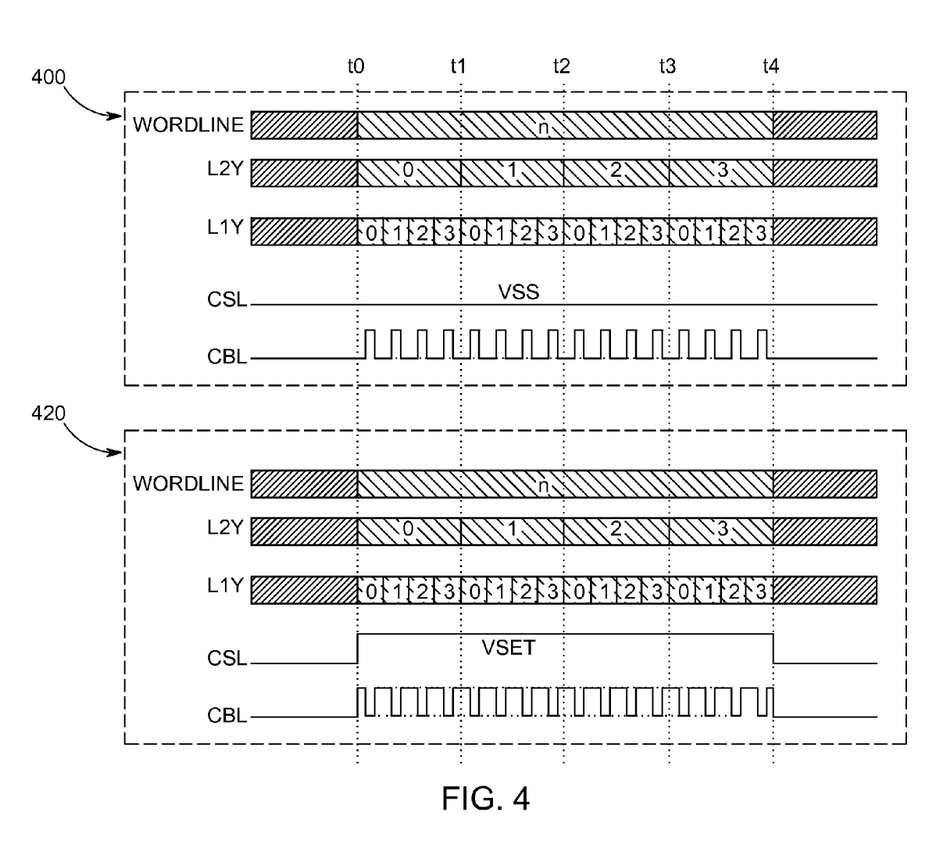
FIG. 4 depicts an addressing sequence for performing operations on the memory cells using the column select circuit depicted in FIG. 2 for page assignment in the X direction in accordance with exemplary embodiments of the present invention.

FIG. 4 depicts an addressing sequence for performing operations on the memory cells using the column select circuit depicted in FIG. 2 for page assignment in the X direction in accordance with exemplary embodiments of the present invention. In the addressing sequence shown in FIG. 4, an assumption is made that pages and memory cells neighboring each other in the "X-Direction", e.g. between cells sharing a wordline, is negligible.

In the reset operation depicted in diagram 400, at time t0, wordline 200n, l2y<0> and l1y<0> are selected. CSL remains at Vss, while CBL is raised to Vreset. From time t0 to t1, time t1 to t2, t2 to t3, and t3 to t4, l1y<0> to l1y<3> are sequentially selected. CBL initially is at Vss, but is raised after time t0 to Vreset and lowered back to set for each l1y<0> to l1y<3> selection. Effectively, each cell in each of pages p0 to p7 is selected sequentially and a reset operation is performed sequentially. Those of ordinary skill in the art will recognize that thermal disturbance is negligible in the X-direction (e.g., among those cells sharing a wordline).

In the set operation depicted in diagram 420, at time t0, wordline n, l2y<0> and l1y<0> are selected. CSL goes to Vset, while CBL is raised to Vset. From time t0 to t1, time t1 to t2, t2 to t3, and t3 to t4, l1y<0> to l1y<3> are sequentially selected. CBL is lowered after time t0 to Vss and then raised to Vset for each l1y<0> to l1y<3> selection. Effectively, each cell in each of pages p0 to p7 is selected sequentially and a set operation is performed sequentially.

Figure 5:
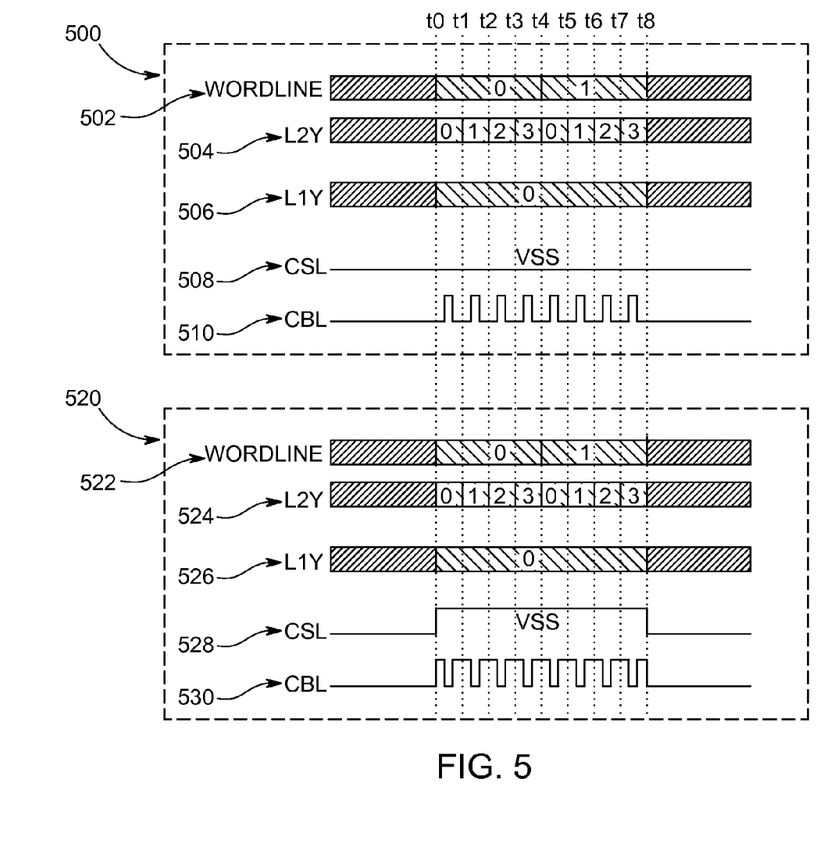
FIG. 5 depicts an addressing sequence for performing operations on the memory cells using the column select circuit depicted in FIG. 2 for page assignment in the Y direction in accordance with exemplary embodiments of the present invention.

FIG. 5 depicts an addressing sequence for performing operations on the memory cells using the column select circuit depicted in FIG. 2 for page assignment in the Y direction in accordance with exemplary embodiments of the present invention. In the addressing sequence shown in FIG. 5, an assumption is made that pages and memory cells neighboring each other in the "Y-Direction", e.g. between cells sharing a bitline, is negligible.

In the reset operation depicted in diagram 500, at time t0, wordline n, l2y<0> and l1y<0> are selected. CSL remains at Vss, while CBL is raised to Vreset shortly after time t0. From time t0 to t1, time t1 to t2, t2 to t3, and t3 to t4, l2y<0> to l2y<3> are sequentially selected. At time t4 to time t8, wordline n+1 is selected. From time t4 to t5, time t5 to t6, t6 to t7, and t7 to t8, l2y<0> to l2y<3> are sequentially selected. CBL is lowered after time t0 from Vset to Vss and then raised to Vset for each between each time interval t0 to t1, t1 to t2, t3 to t4 and so on. Effectively, a first page is formed by addressing the first memory cells in each of pages p0 to p7.

Similarly, in the set operation depicted in diagram 520, at time t0, wordline 0, l2y<0> and l1y<0> are selected. CSL goes to Vset at time t0, while CBL is raised to Vset at time t0. At time t0 to time t4, wordline n is selected. From time t0 to t1, time t1 to t2, t2 to t3, and t3 to t4, l2y<0> to l2y<3> are sequentially selected. At time t4 to time t8, wordline n+1 is selected. From time t4 to t5, time t5 to t6, t6 to t7, and t7 to t8, l2y<0> to l2y<3> are sequentially selected. CBL is lowered after time t0 from Vset to Vss and then raised to Vset prior to t1, for each time interval t0 to t1, t1 to t2, t3 to t4 and so on. Effectively, a first page is formed by addressing the first memory cells in each of pages p0 to p7 without modifying the circuit.

Figure 6:
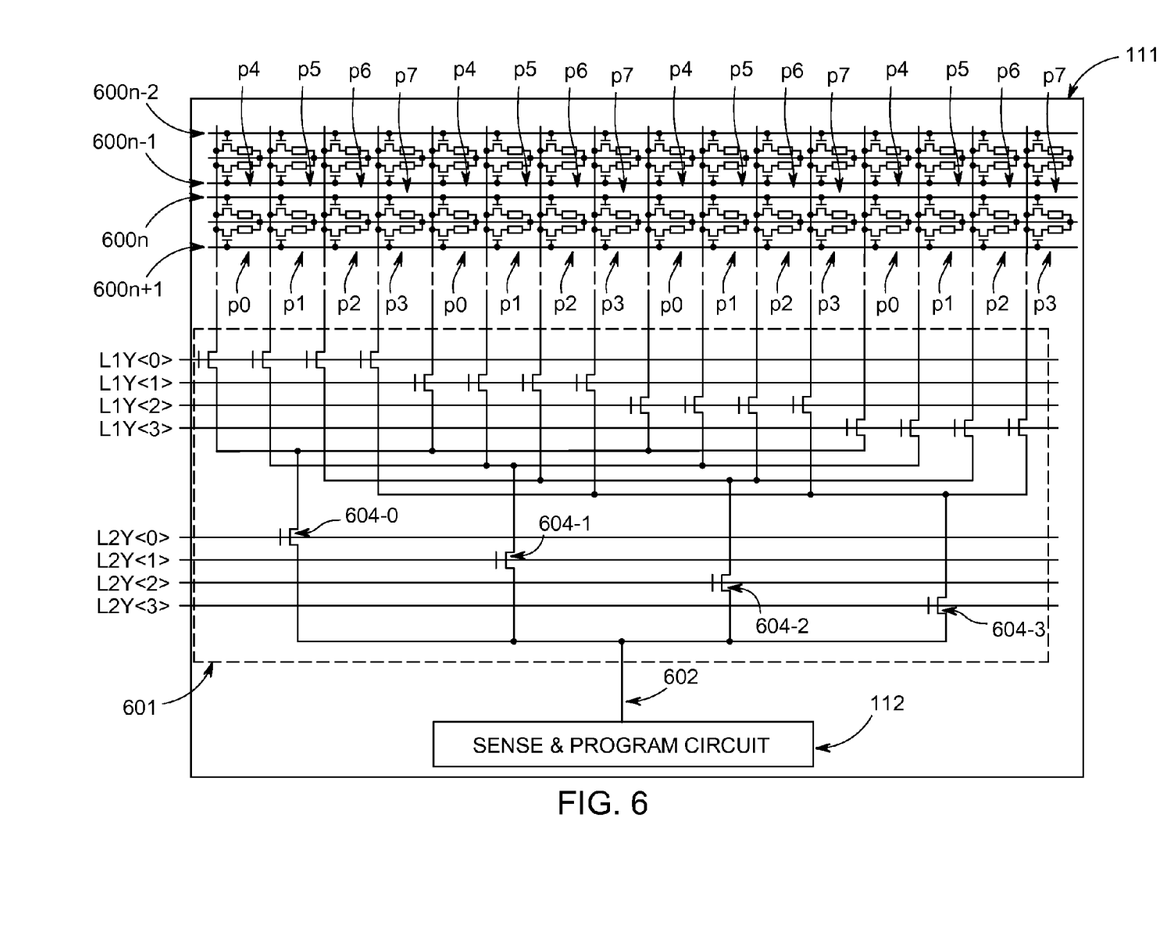
FIG. 6 depicts another embodiment of a column select circuit for single sub-tile in a memory tile in accordance with exemplary embodiments of the present invention.

FIG. 6 depicts another embodiment of a column select circuit 601 for a single sub-tile 111 in a memory tile 110 in accordance with exemplary embodiments of the present invention.

Sub-tile 111 comprises a finite number of wordlines; those shown in FIG. 6 include 600n−2 to 600n+1 (collectively, wordlines 600). Those of ordinary skill in the art will recognize that each subtile may contain many wordlines to access a variety of different cells on the memory device. The sub-tile 111 comprises a plurality of memory cells, the cells aggregated into eight (for example) "pages" p0 to p7. The sense and program circuit 112 issues pulses to perform operations such as programming memory cells, sensing the value stored in memory cells and the like. The pulses are issued to the various memory cells via the common bit line (CBL) 602. The column select circuit 601 comprises a level one select (l1y) and a level 2 select (l2y). The CBL 602 is coupled to the l2y column selects respectively via switches 604-0 to 604-3. The wordlines 600 select a "row" of cells. The level 2 select (l2y) selects a group of four cells (one page) while the level 1 select (l1y) selects a particular cell. For example, an operation on the first cell of page p0 will be performed if wordline 600n+1 is selected, l2y<0> is selected and l1y<0> is selected. Similarly, an operation on the first cell of page p1 will be performed if wordline 600n+1 is selected, and l2y<1> and l1y<0> are selected.

Column select circuit 601 differs from column select circuit 201 in that each l2y selects non-adjacent memory cells. For example, the memory cells associated with page 0 are now located 3 cells away from each other, where in FIG. 2 the memory cells for page 0 were directly adjacent to each other.

Figure 7:
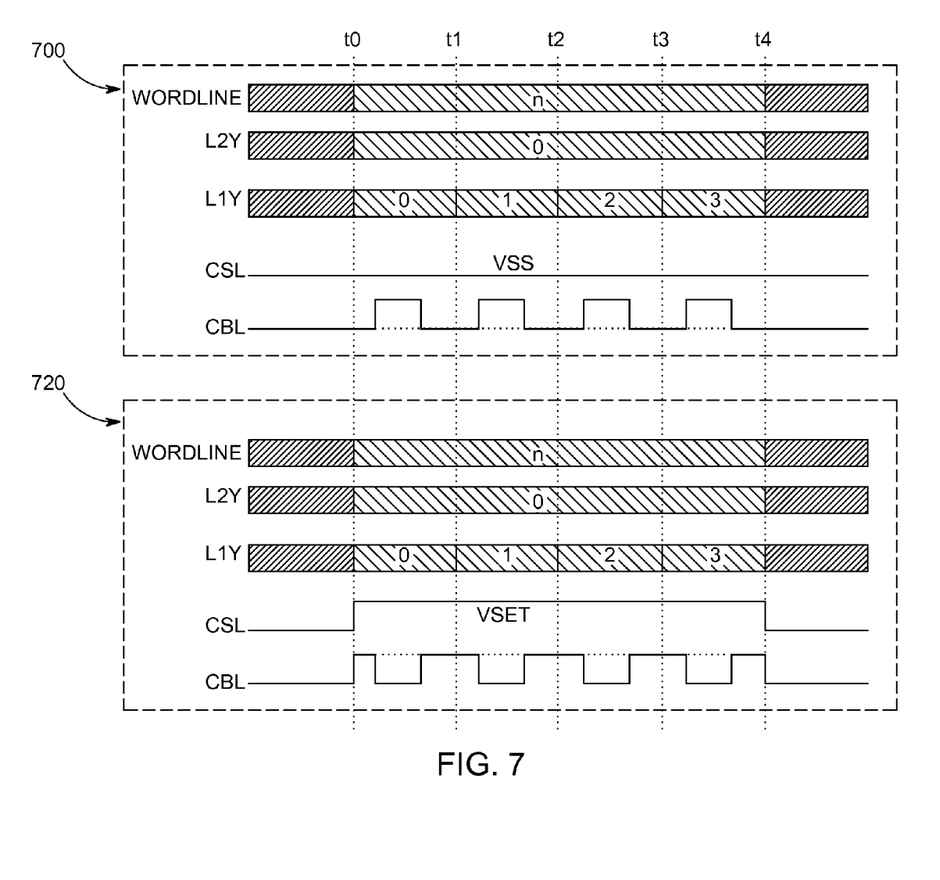
FIG. 7 depicts an addressing sequence for performing operations on the memory cells using the column select circuit depicted in FIG. 6 in accordance with exemplary embodiments of the present invention.

Accordingly, the addressing performed by the sense & program circuit 112 is a conventional addressing shown in FIG. 7, as the circuit 601 is modified.

FIG. 7 depicts an addressing sequence for performing operations on the memory cells using the column select circuit depicted in FIG. 6 in accordance with exemplary embodiments of the present invention.

In diagram 700 of a reset operation, at time t0 to time t4, wordline n and l2y<0> are selected. The level 1 column select l1y sequentially selects l1y<0> at time t0, l1y<1> at time t1, l1y<2> at time t2, and l1y<3> at time t3. CSL remains at Vss, while CBL 602 goes to Vreset after time t0 and drops to Vss before time t1, and similarly for time t1 to t2, t2 to t3 and t3 to t4.

In diagram 700 of a reset operation, at time t0 to time t4, wordline n and l2y<0> are selected. The level 1 column select l1y sequentially selects l1y<0> at time t0, l1y<1> at time t1, l1y<2> at time t2, and l1y<3> at time t3. CSL goes to Vset at time t0, while CBL 602 goes to Vset at time t0 and drops to Vss shortly after time 0, and returns to Vset before time t1, and similarly for time t1 to t2, t2 to t3 and t3 to t4. Effectively, every fourth bit is selected to form a page to avoid thermal disturbance of adjacent pages.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A memory device comprising:
    a plurality of sub-tiles in a memory section configured to include a plurality of memory cells;
    a plurality of wordlines each configured to couple to a row of memory cells in the sub-tile; and
    a column select circuit configured to control at least two level column lines;
    a common bit line (CBL) coupled to the column select circuit, the common bit line also coupled to a sense and program circuit;
    a common source line (CSL) coupled to the memory section,
    wherein a selected time of one of the two level column lines is different from that of the other of the two level column lines, and
    a pulse of the common source line is set to a low voltage for a reset operation.

2. The memory device of claim 1, wherein the sense and program circuit addresses each first memory cell in groups of the plurality of memory cells to form a single page of memory for the reset operation.

3. The memory device of claim 1, wherein a pulse of the common bit line for the reset operation is different from a pulse of the common bit line for a set operation.

4. The memory device of claim 1, wherein the common source line (CSL) is set to a high voltage for a set operation.

* * * * *